United States Patent
Kagaya

(10) Patent No.: US 11,294,129 B2
(45) Date of Patent: Apr. 5, 2022

(54) OPTICAL MODULE AND OPTICAL TRANSMISSION DEVICE

(71) Applicant: CIG Photonics Japan Limited, Kanagawa (JP)

(72) Inventor: Osamu Kagaya, Tokyo (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 0 days.

(21) Appl. No.: 17/155,133

(22) Filed: Jan. 22, 2021

(65) Prior Publication Data
US 2021/0239925 A1 Aug. 5, 2021

(30) Foreign Application Priority Data
Jan. 30, 2020 (JP) .............................. JP2020-013555

(51) Int. Cl.
| | |
|---|---|
| *H04B 10/00* | (2013.01) |
| *G02B 6/42* | (2006.01) |
| *H01S 5/042* | (2006.01) |
| *H01S 5/02325* | (2021.01) |
| *H01S 5/02212* | (2021.01) |

(52) U.S. Cl.
CPC ........ *G02B 6/4263* (2013.01); *H01S 5/02212* (2013.01); *H01S 5/02325* (2021.01); *H01S 5/0427* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,659,273 | A | * | 8/1997 | Harpham ............ H04L 25/0266 333/177 |
| 6,448,813 | B2 | * | 9/2002 | Garlepp ............. H03K 19/0005 326/27 |
| 8,274,307 | B1 | * | 9/2012 | Ben Artsi ............... H01P 5/028 326/30 |
| 9,143,236 | B1 | * | 9/2015 | Bartur .................. H04B 10/071 |
| 10,790,636 | B1 | * | 9/2020 | Abdelhalim ......... H04B 1/0475 |

(Continued)

FOREIGN PATENT DOCUMENTS

| | | |
|---|---|---|
| JP | 2004-047830 A | 2/2004 |
| JP | 2004-193489 A | 7/2004 |
| JP | 2016-072288 A | 5/2016 |

*Primary Examiner* — Agustin Bello
(74) *Attorney, Agent, or Firm* — Mattingly & Malur, PC

(57) ABSTRACT

In an optical module, optical signal output having satisfactory waveform and intensity can be obtained. A differential transmission line includes a first differential transmission line, which has a first characteristic impedance and is connected to a drive IC, a second differential transmission line, which has a second characteristic impedance and is connected to a light output element, the second characteristic impedance being smaller than the first characteristic impedance, and connecting portions configured to connect the first differential transmission line and the second differential transmission line in series with each other. A resistive element is arranged between the connecting portions. The resistive element has a resistance value that is set to a value with which an absolute value of a reflection coefficient for a signal traveling from the second differential transmission line side to the first differential transmission line side is 0.10 or less.

11 Claims, 12 Drawing Sheets

(56) References Cited

U.S. PATENT DOCUMENTS

| | | | |
|---|---|---|---|
| 11,224,120 B2* | 1/2022 | Kagaya | H01P 3/026 |
| 2004/0071219 A1* | 4/2004 | Vorenkamp | H04B 3/144 |
| | | | 375/257 |
| 2004/0114650 A1* | 6/2004 | Tanaka | H01S 5/042 |
| | | | 372/38.02 |
| 2005/0110529 A1* | 5/2005 | Pradhan | H04L 25/0282 |
| | | | 327/108 |
| 2005/0121684 A1* | 6/2005 | Aruga | G02B 6/4204 |
| | | | 257/99 |
| 2005/0194663 A1* | 9/2005 | Ishimura | H01S 5/0427 |
| | | | 257/666 |
| 2005/0214957 A1* | 9/2005 | Kihara | G02B 6/4204 |
| | | | 438/14 |
| 2005/0239431 A1* | 10/2005 | Yamamoto | H04B 3/56 |
| | | | 455/333 |
| 2006/0176918 A1* | 8/2006 | Aruga | H01S 5/02345 |
| | | | 372/38.1 |
| 2007/0023766 A1 | 2/2007 | Aruga et al. | |
| 2007/0248363 A1* | 10/2007 | Kagaya | H01S 5/02325 |
| | | | 398/200 |
| 2008/0170052 A1* | 7/2008 | Ryu | G09G 3/3275 |
| | | | 345/204 |
| 2008/0170063 A1* | 7/2008 | Ryu | G09G 3/2096 |
| | | | 345/214 |
| 2008/0211791 A1* | 9/2008 | Ryu | G09G 3/3688 |
| | | | 345/204 |
| 2009/0263140 A1* | 10/2009 | Kagaya | H05K 1/025 |
| | | | 398/139 |
| 2010/0135675 A1* | 6/2010 | Tanaka | H01S 5/06213 |
| | | | 398/192 |
| 2010/0183318 A1* | 7/2010 | Tanaka | H04B 10/504 |
| | | | 398/201 |
| 2012/0057864 A1* | 3/2012 | Lim | G02B 6/4286 |
| | | | 398/9 |
| 2012/0229998 A1* | 9/2012 | Kagaya | H01P 3/088 |
| | | | 361/777 |
| 2012/0269522 A1* | 10/2012 | Kagaya | H05K 1/0218 |
| | | | 398/183 |
| 2013/0241602 A1* | 9/2013 | Shirota | H04L 25/029 |
| | | | 327/108 |
| 2015/0222236 A1* | 8/2015 | Takemoto | H03F 3/08 |
| | | | 250/214 A |
| 2016/0141830 A1* | 5/2016 | Kim | H01S 5/02212 |
| | | | 372/34 |
| 2016/0191196 A1* | 6/2016 | Troiani | H01S 5/0428 |
| | | | 398/52 |
| 2017/0139160 A1* | 5/2017 | Noguchi | G01J 1/44 |
| 2017/0331250 A1* | 11/2017 | Kagaya | H05K 1/181 |
| 2018/0062589 A1* | 3/2018 | Bazzani | H04B 10/50 |
| 2018/0177042 A1* | 6/2018 | Kagaya | H01P 3/081 |
| 2019/0069395 A1* | 2/2019 | Noguchi | H01R 12/65 |
| 2019/0377143 A1* | 12/2019 | Tsuchiyama | G02B 6/421 |
| 2020/0045808 A1* | 2/2020 | Kagaya | H01P 5/028 |
| 2020/0083663 A1* | 3/2020 | Tsuchiyama | H01S 5/02212 |
| 2021/0239925 A1* | 8/2021 | Kagaya | H04B 10/40 |
| 2021/0288463 A1* | 9/2021 | Kwon | H01S 5/02461 |
| 2021/0297293 A1* | 9/2021 | Lee | H04L 25/0272 |

* cited by examiner

OPTICAL MODULE AND OPTICAL TRANSMISSION DEVICE

CROSS-REFERENCE TO RELATED APPLICATION

The present application claims priority from Japanese patent application JP2020-013555 filed on Jan. 30, 2020, the contents of which are hereby incorporated by reference into this application.

BACKGROUND

1. Field

The present invention relates to an optical module and an optical transmission device, in particular, an optical transmission circuit configured to convert an electric signal into an optical signal.

2. Description of the Related Art

Optical communication systems use an optical module including an optical transmission circuit configured to convert an electric signal into an optical signal, and an optical reception circuit configured to convert an optical signal into an electric signal. A generally used optical module is an optical transceiver (optical transceiver module) having both of a transmission function and a reception function. Optical transceiver modules are increased in speed, downsized, and reduced in cost as broadband networks become widespread in recent years, and those having a modulation rate of from 25 to 28 gigabits/second (Gbit/s) have become widely used in terms of the increase in speed. In terms of the downsizing and the reduction in cost, a case volume and the number of parts have been reduced as in, for example, the multi-source agreement (MSA) specification of Small Form-factor Pluggable 28 (SFP28).

An optical module contains, in one case, optical subassemblies (OSAs), a circuit board formed from a rigid board, and flexible printed circuits configured to connect the optical subassemblies and the circuit board to each other. The optical subassemblies include a transmitter optical subassembly (TOSA) used in the optical transmission circuit, and a receiver optical subassembly (ROSA) used in the optical reception circuit.

The TOSA is configured to convert an electric signal, which has been input from the circuit board, into an optical signal, and output the optical signal. The TOSA includes a light emitting element and an optical modulator. For long-distance, high-speed transmission, light source and optical modulators configured to directly modulate a distributed feedback laser diode (DFB-LD), which is a semiconductor laser, are often used, for example. Incidentally, in the optical modulator employing the direct modulation system, a drive current supplied from a drive circuit outside the TOSA to the semiconductor laser is modulated in accordance with a transmission signal, to thereby apply modulation to laser light output. Package forms of a TO-can type are often adopted for the TOSA in order to reduce the cost. Incidentally, a TO-can package has the structure obtained by putting a cap on a stem having mounted thereon a light output element, for example, the semiconductor laser, and the inside and the outside of the package are electrically connected to each other through lead pins penetrating through the stem.

The optical transmission circuit includes a drive circuit configured to generate the electric signal to be input as a modulated signal to the TOSA. The drive circuit is formed of an integrated circuit (IC), and the drive IC is arranged on the circuit board.

The modulated signal output from the drive circuit is basically a high frequency signal to correspond to a high transmission speed of the optical signal, and the drive circuit and the TOSA are connected to each other through transmission lines, such as microstriplines or striplines, to pass the high frequency signal. Further, also in the lead pin portion of the TO-can package, a gap is formed between each lead pin and a hole in the stem through which the lead pin penetrates, and glass is filled as a dielectric in the gap. Thus, the lead pin portion is formed into a transmission line having a coaxial shape (Japanese Patent Application Laid-open No. 2004-47830).

Further, in order to increase a current amplitude of the semiconductor laser, that is, to set an extinction ratio of the optical signal output from the semiconductor laser sufficiently high, there is widely used a configuration in which the semiconductor laser and the drive IC are connected to each other through a balanced line, and further a differential output impedance of the drive IC is set to 50 ohms ($\Omega$), which is half of 100$\Omega$ generally used in electronic circuits. In other words, in this configuration, the drive IC and the semiconductor laser are connected to each other through a differential transmission line, which is formed of a pair of transmission lines, and a differential impedance of the differential transmission line is set to 50$\Omega$.

The value of the differential impedance is also advantageous in forming the TOSA of the TO-can type. In other words, when the inside and the outside of the package are connected to each other through a pair of coaxial lines formed with the use of the lead pins, in order to obtain a large differential impedance, it is also required to set an inside diameter of an outer conductor of each coaxial line (that is, the size of the hole of the stem) large. Therefore, when the differential impedance is set to 50$\Omega$ rather than 100$\Omega$, the inside diameter of the outer conductor can be reduced, and the TO-can package can be downsized.

In Japanese Patent Application Laid-open No. 2004-193489, there is disclosed a circuit technology for an optical transmission module, in which the semiconductor laser and the drive IC are connected to each other through a balanced line, to thereby increase the current amplitude of the semiconductor laser.

For evaluation of characteristics of the drive IC and the optical modulator, a general measuring instrument includes an input of a 50-$\Omega$ system, which corresponds to 100$\Omega$ in a differential impedance. In other words, when the optical transmission circuit adopts a configuration in which the drive IC and the TOSA are connected to each other through a balanced line with a differential impedance of 50$\Omega$, it is difficult to correctly evaluate characteristics of the drive IC or the TOSA alone, which is compatible with the differential impedance, with the use of the general measuring instrument.

Meanwhile, for the increase in speed, a transition from a related-art 2-level pulse amplitude modulation (NRZ) to a 4-level pulse amplitude modulation (PAM4) is being performed. With this transition, it is required for the drive IC to transition from anon/off-type amplifier to a linear amplifier. Linear amplifiers for the PAM4 having the differential output impedance of 100$\Omega$ are being developed presumably under the above-mentioned circumstances surrounding the measuring instrument used to evaluate electric characteristics of the linear amplifiers. When, in accordance with the linear amplifiers, the optical transmission circuit adopts a configuration in which the drive IC and the TOSA are connected to each other through a balanced line with a differential impedance of 100Ω, it becomes difficult to downsize the TO-can package for the above-mentioned reasons, and hence downsizing of the optical module is inhibited.

To address the above-mentioned problem, it is considered for the optical transmission circuit to adopt a configuration in which a drive IC having a differential output impedance of 100Ω and a TOSA having a differential input impedance of 50Ω are used. However, with this configuration, an impedance mismatch point may occur between the drive IC and the TOSA. The mismatch point may reflect, of the electric signal that has reached the TOSA from the drive IC, a component that has been reflected at the input of the TOSA and returns to the drive IC, back to the TOSA again. In other words, multireflection of the electric signal occurs between the mismatch point and the TOSA, which leads to a problem that it is difficult to obtain optical signal output having a satisfactory waveform from the TOSA.

To address this problem, in Japanese Patent Application Laid-open No. 2016-72288, there is disclosed a circuit technology in which a differential impedance of a transmission line closer to the semiconductor laser is set to 50Ω while a differential impedance of a transmission line closer to the drive IC is set to 100Ω, and a resistive attenuator circuit is arranged between the two transmission lines having the different characteristic impedances, to thereby match the impedances between the transmission lines. However, an attenuation in the resistive attenuator circuit is theoretically as large as 7.7 dB or more, and hence it is difficult to sufficiently increase the current amplitude of the semiconductor laser.

SUMMARY

The present invention has been made to solve the above-mentioned problem, and therefore has an object to provide an optical module and an optical transmission device as follows. The optical module includes an optical transmission circuit, in which a TOSA and a drive circuit are connected to each other through a balanced line. In the optical module, a drive circuit having a differential output impedance of 100Ω is used as the drive circuit, and a TOSA having a differential input impedance of 50Ω is used as the TOSA, to thereby suppress multireflection of an electric signal on a differential transmission line and reduce an attenuation of an input signal to a light output element while downsizing and reducing cost of the TOSA. With the optical module, optical signal output having satisfactory waveform and intensity can be obtained.

(1) An optical module according to the present invention includes: a light output element which includes a pair of input terminals, and is configured to output an optical signal modulated in accordance with an electric signal input to the light output element; a drive circuit which includes a pair of output terminals, and is configured to output a differential signal as the electric signal; a differential transmission line which establishes connection between the pair of input terminals and the pair of output terminals, and is formed of a pair of transmission lines, the differential transmission line including: a first differential transmission line which has a first characteristic impedance, and is connected to the pair of output terminals; a second differential transmission line which has a second characteristic impedance, and is connected to the pair of input terminals, the second characteristic impedance being smaller than the first characteristic impedance; and connecting portions configured to connect the first differential transmission line and the second differential transmission line in series with each other; and a resistive element having both ends connected to the connecting portions of the pair of transmission lines, respectively, the resistive element having a resistance value that is set to a value with which an absolute value of a reflection coefficient for a signal traveling from the second differential transmission line side to the first differential transmission line side is 0.10 or less.

(2) The optical module according to the above-mentioned item (1) may further include: a circuit board on which an integrated circuit having the drive circuit formed therein is mounted; and flexible printed circuits connected between the light output element and the circuit board, and the pair of transmission lines may each include signal conductors formed of strip conductor foil formed on the circuit board and the flexible printed circuits.

(3) In the optical module according to the above-mentioned item (2), the connecting portions may be arranged on the circuit board, and the resistive element may be mounted on the circuit board.

(4) In the optical module according to the above-mentioned item (2), the connecting portions may be arranged on the flexible printed circuits, and the resistive element may be mounted on the flexible printed circuits.

(5) The optical module according to any one of the above-mentioned items (2) to (4) may further include optical subassemblies each having the light output element mounted in a package thereof, and the optical subassemblies may be connected to the flexible printed circuits. The second differential transmission line may include package wirings from connection terminals of the optical subassemblies to the flexible printed circuits, to the light output element.

(6) In the optical module according to the above-mentioned item (5), the package may be a TO-can package, the TO-can package may have holes formed in a stem, and lead pins which penetrate through the holes, and the second differential transmission line may include, as the package wirings, a pair of coaxial lines including a pair of the lead pins connected to the pair of input terminals of the light output element, and a pair of the holes formed in correspondence with the lead pins.

(7) In the optical module according to any one of the above-mentioned items (1) to (6), the drive circuit may have a differential output impedance that matches the first characteristic impedance.

(8) In the optical module according to any one of the above-mentioned items (1) to (6), each of a differential output impedance of the drive circuit and the first characteristic impedance may be 100 ohms, the second characteristic impedance may be 50 ohms, and the resistance value of the resistive element may be 100 ohms.

(9) The optical module according to any one of the above-mentioned items (1) to (8) may further include: a DC blocking capacitor inserted on the second differential transmission line; and bias circuits which are connected to the second differential transmission line on the light output element side as seen from the DC blocking capacitor, and are configured to supply a bias current to the light output element.

(10) In the optical module according to any one of the above-mentioned items (1) to (9), the drive circuit may include a current-mode logic circuit as an output circuit configured to output the differential signal to the pair of output terminals, the current-mode logic circuit may include a pull-up resistor having a resistance value that is ½ of the first characteristic impedance, and the optical module may further include bias circuits each of which includes an inductance, and which are connected to the first differential transmission line.

(11) An optical transmission device according to at least one embodiment of the present invention includes the optical module of anyone of the above-mentioned items (1) to (10) mounted thereon.

According to the present invention, the following optical module and optical transmission device can be provided. The optical module includes the optical transmission circuit, in which the TOSA and the drive circuit are connected to each other through the balanced line. With the optical module, it is possible to suppress multireflection of the electric signal on the differential transmission line and reduce the attenuation of the input signal to the light output element while downsizing and reducing cost of the TOSA, and to obtain the optical signal output having satisfactory waveform and intensity.

DETAILED DESCRIPTION

Now, modes for embodying the present invention (hereinafter referred to as "embodiments") are described with reference to the accompanying drawings. Throughout the figures for illustrating the embodiments, like reference symbols are used to represent members having like functions, and a duplicate description thereof is omitted. The drawings referred to in the following are only for illustrating the embodiments by way of examples, and are not necessarily drawn to scale.

First Embodiment

Figure 1:
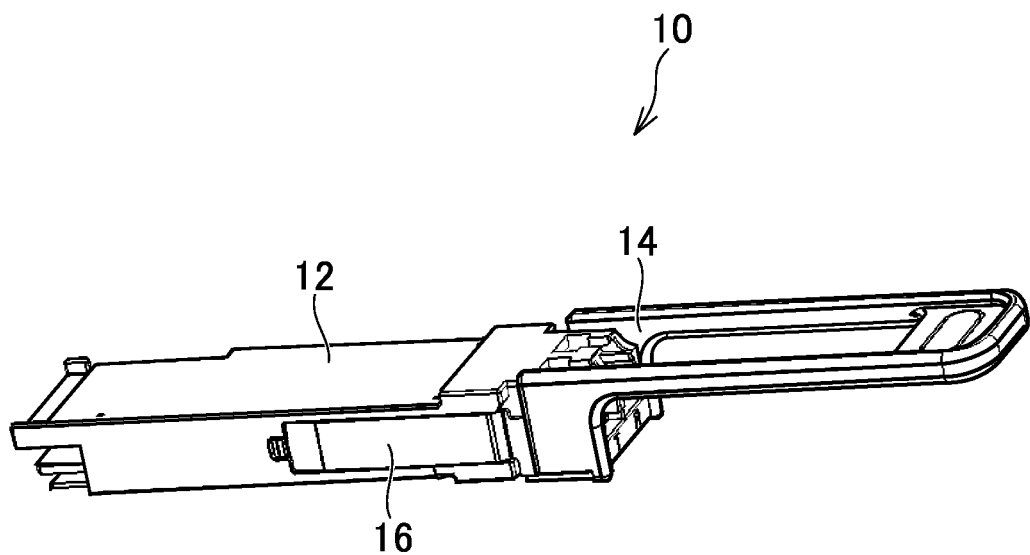
FIG. 1 is a schematic exterior view of an optical module according to embodiments of the present invention.

FIG. 1 is a schematic exterior view of an optical module 10 according to a first embodiment to which the present invention is applied. The optical module 10 is an optical transceiver, and has an outside shape formed of components including a metal case 12, a pull tab 14, and a slider 16.

Figure 2:
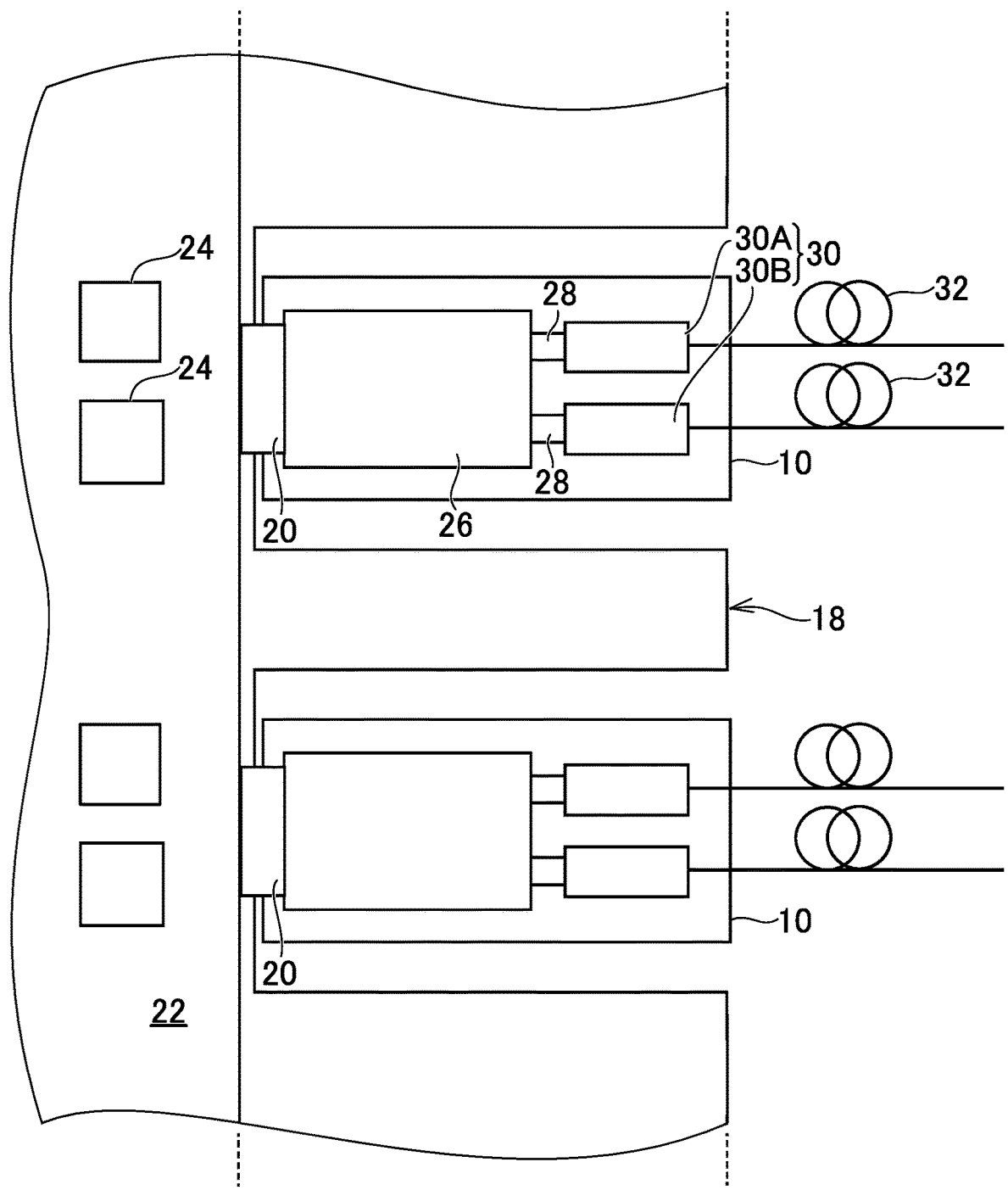
FIG. 2 is a schematic diagram for illustrating a configuration of an optical transmission device according to the embodiments of the present invention.

FIG. 2 is a schematic diagram for illustrating a configuration of an optical transmission device 18 having the optical modules 10 mounted thereon. To the optical transmission device 18, a plurality of the optical modules 10 are mounted via electric connectors 20, respectively. The optical transmission device 18 is, for example, a router or switch having a large capacity. The optical transmission device 18 has a function of a switchboard, for example, and is arranged in a base station, for example. The optical transmission device 18 is configured to obtain data for reception (electric signal for reception) from the optical module 10, determine what data is to be transmitted to which destination with the use of driver ICs 24 mounted on a circuit board 22, for example, generate data for transmission (electric signal for transmission), and transfer the data to the optical module 10 of interest.

The optical module 10 includes a printed circuit board (PCB) 26, flexible printed circuits (FPCs) 28, and a plurality of optical subassemblies 30 for conversion between an optical signal and an electric signal. Specifically, a ROSA 30A and a TOSA 30B are included as the optical subassemblies 30. It is assumed here that the ROSA and the TOSA encompass a bi-directional optical subassembly (BOSA) having optical transmission and reception functions. The optical module 10 in the first embodiment is a transceiver having both of a transmission function and a reception function, but the optical module according to the present invention may have only the transmission function, that is, include only the TOSA.

The printed circuit board 26 is made from a non-flexible rigid board. The printed circuit board 26 and the plurality of optical subassemblies 30 are connected to each other via the flexible printed circuits 28. An electric signal is transmitted from the ROSA 30A to the printed circuit board 26 via the flexible printed circuits 28. Further, an electric signal is transmitted from the printed circuit board 26 to the TOSA 30B via the flexible printed circuits 28. Light conversion elements included in the optical subassemblies 30 are elements configured to convert one of an optical signal and an electric signal into the other. A light conversion element configured to convert an electric signal into an optical signal has a light emitting function and a light modulation function, and is called a "light output element" herein. The TOSA 30B includes a light output element. Meanwhile, the ROSA 30A includes a light receiving element as a light conversion element configured to convert an optical signal into an electric signal. For input and output of the optical signals, optical fibers 32 are connected to the optical subassemblies 30.

Figure 3:
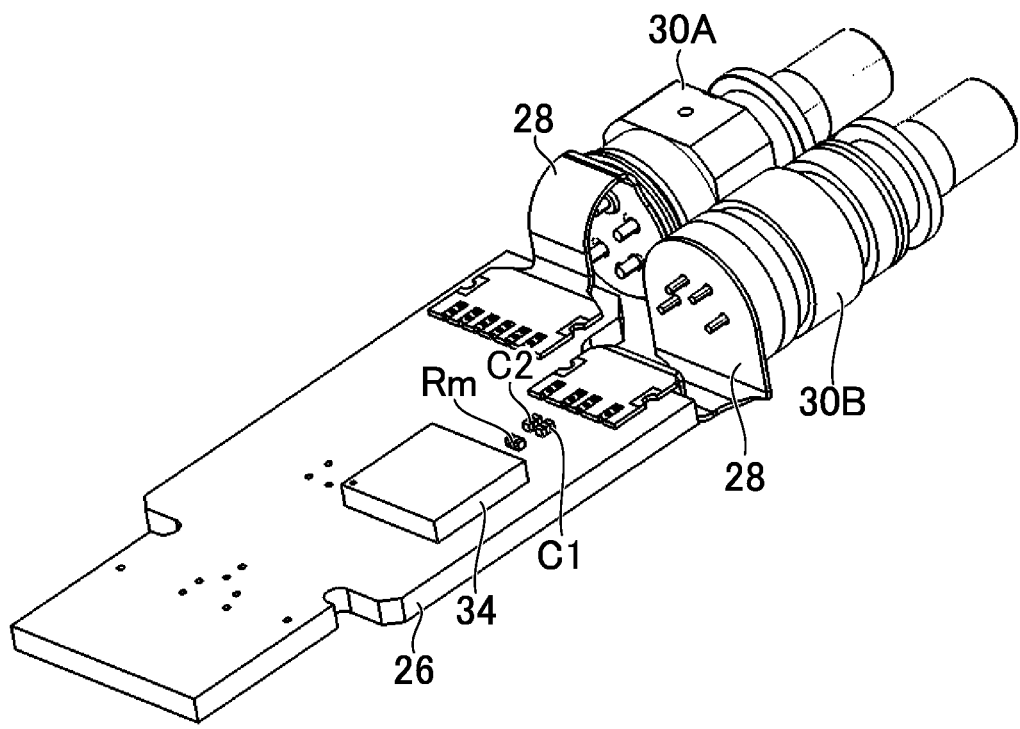
FIG. 3 is a schematic perspective view for illustrating the structure of main parts mounted inside a metal case of the optical module according to the embodiments of the present invention.

FIG. 3 is a schematic perspective view for illustrating the structure of main parts mounted inside the metal case 12 of the optical module 10. The optical module 10 is a 50-Gbit/s-class optical transceiver, for example, an SFP56 MSA-compliant optical transceiver. The main parts include the ROSA 30A, the TOSA 30B, the printed circuit board 26, and the flexible printed circuits 28. Connections between the ROSA 30A and the printed circuit board 26, and between the TOSA 30B and the printed circuit board 26 are established using the flexible printed circuits 28, which have flexibility. In other words, the ROSA 30A and the TOSA 30B are connected to one end portions of the flexible printed circuits 28, respectively, and the other end portions of the flexible printed circuits 28 overlap and are electrically connected to the printed circuit board 26.

The TOSA 30B is formed of a TO-can package. The TO-can package is used to downsize and reduce a cost of the TOSA 30B. Though not shown in FIG. 3, one semiconductor laser LD1 as a light output element is mounted inside the TO-can package. As transmission lines (transmission lines 56a and 56b of FIG. 4) between the flexible printed circuits 28 and the semiconductor laser LD1, a pair of coaxial lines formed of holes in a stem and lead pins are provided in the TO-can package.

The printed circuit board 26 is formed of a plurality of layers including conductive layers and a dielectric layer. Copper is used for the conductive layers, and a material (glass epoxy resin) made of a glass fabric substrate and an epoxy resin is used for the dielectric layer. Circuit wirings and the ground are formed with the conductive layers in the printed circuit board 26. In the printed circuit board 26, a differential transmission line to be described later is formed with the use of the conductive layers and the dielectric layer. Further, electronic components are mounted on the printed circuit board 26, and a circuit for processing a reception signal from the ROSA 30A, and a circuit for driving the TOSA 30B are formed with the electronic components. FIG. 3 shows, as the electronic components mounted on the surface of the printed circuit board 26, a drive IC 34 configured to drive the TOSA 30B, and a resistive element Rm and capacitors C1 and C2, which are to be described later. The resistive element Rm is, for example, a surface-mount chip resistor of 0603 size. Further, the capacitors C1 and C2 are, for example, surface-mount chip capacitors of the 0603 size.

The flexible printed circuits 28 have a configuration in which, for example, a polyimide film having a thickness of about 50 micrometers (pm) is used as an insulating layer, and the conductive layers made of copper are arranged on both sides of the insulating layer. On the flexible printed circuits 28, a differential transmission line, which is to be described later, is formed with the use of the conductive layers and the insulating layer.

Figure 4:
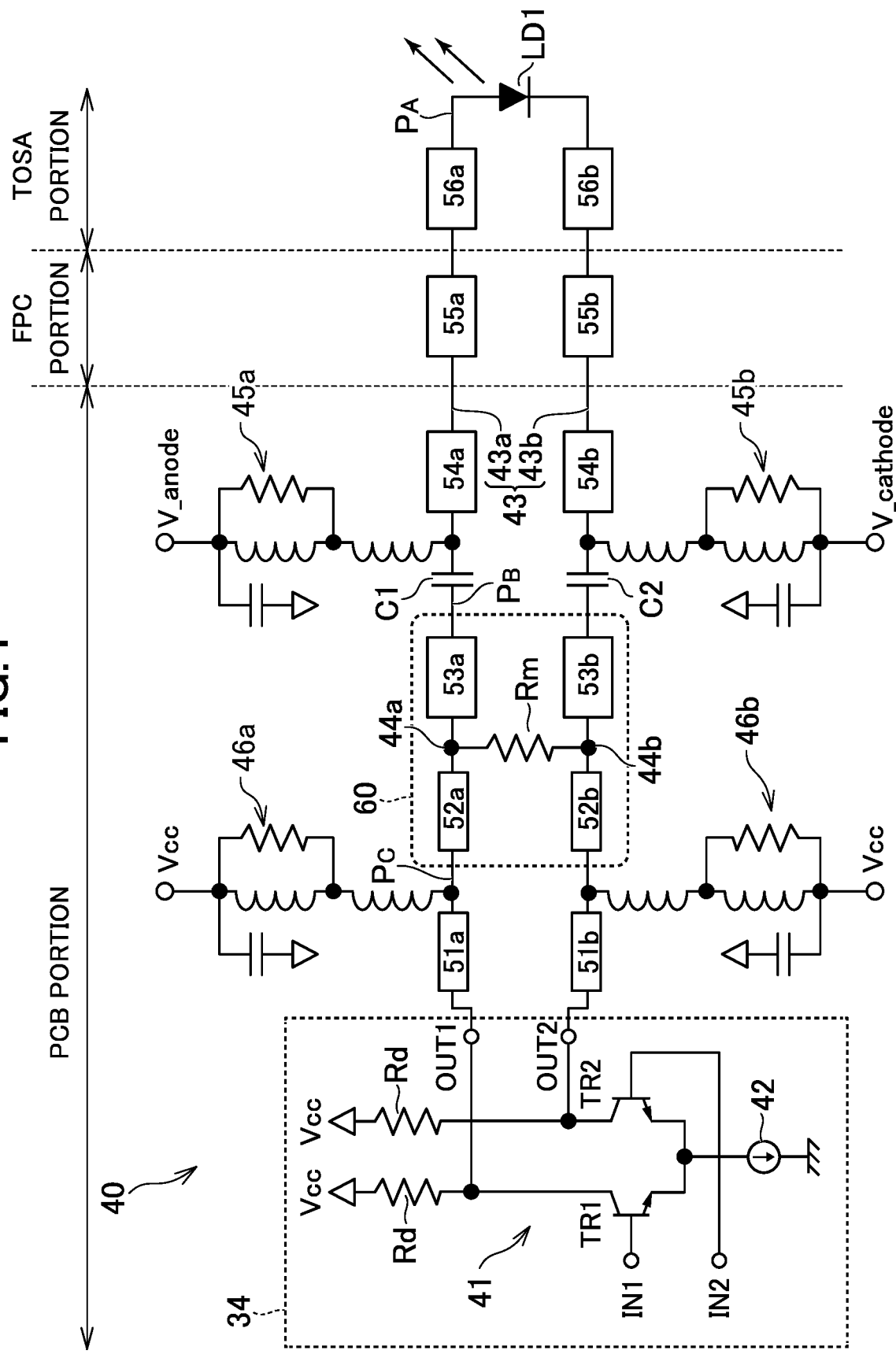
FIG. 4 is a schematic circuit diagram of a transmission unit of an optical module according to a first embodiment of the present invention.

FIG. 4 is a schematic circuit diagram of a transmission unit 40 of the optical module 10 according to the first embodiment. The transmission unit 40 includes a portion included in the TOSA (TOSA portion), a portion formed on the flexible printed circuits 28 (FPC portion), and a portion formed on the printed circuit board 26 (PCB portion). In the TOSA portion, the semiconductor laser LD1 is arranged. The semiconductor laser LD1 is, for example, a DFB-LD. In the PCB portion, the drive IC 34 is arranged. The drive IC 34 includes a drive circuit configured to output an electric signal for driving the semiconductor laser LD1, and the drive circuit includes a current mode logic (CML) circuit, for example, as a circuit in an output stage configured to output a differential signal.

FIG. 4 shows the CML circuit from among circuits of the drive IC 34. A CML circuit 41 includes transistors TR1 and TR2, a constant current source 42, and output resistors (pull-up resistors or internal terminating resistors) Rd. The transistors TR1 and TR2 have bases being input terminals IN1 and IN2 and collectors being output terminals OUT1 and OUT2, respectively. The constant current source 42 is connected in common to emitters of the transistors TR1 and TR2. The output resistors Rd are connected between the collectors of the transistors TR1 and TR2 and a power supply voltage $V_{cc}$, respectively, and have the same resistance value. The CML circuit 41 is configured to output, in accordance with a potential difference between differential input signals supplied to the pair of input terminals IN1 and IN2, differential signals as output signals from the pair of output terminals OUT1 and OUT2.

The transmission unit 40 of FIG. 4 includes a differential transmission line 43 formed of a pair of transmission lines 43a and 43b connecting the pair of output terminals OUT1 and OUT2 of the CML circuit 41 and a pair of input terminals of the semiconductor laser LD1, respectively, to connect the drive IC 34 and the semiconductor laser LD1 through a balanced line. Through the differential transmission line 43, a current corresponding to the differential signals output from the output terminals OUT1 and OUT2 is supplied to the semiconductor laser LD1, and the semiconductor laser LD1 is configured to output the optical signal modulated in accordance with the differential signals. Incidentally, in FIG. 4, of an anode and a cathode forming the pair of input terminals of the semiconductor laser LD1, the anode is connected to the output terminal OUT1 through the transmission line 43a, and the cathode is connected to the output terminal OUT2 through the transmission line 43b.

The differential transmission line 43 includes a first differential transmission line, a second differential transmission line, and connecting portions. The first differential transmission line has a first characteristic impedance (differential impedance $Z_{diff1}$), and is connected to the pair of output terminals OUT1 and OUT2 of the drive circuit. The second differential transmission line has a second characteristic impedance (differential impedance $Z_{diff2}$), which is smaller than the first characteristic impedance, and is connected to the pair of input terminals of the semiconductor laser LD1. The connecting portions connect the first differential transmission line and the second differential transmission line in series with each other.

Here, a differential output impedance of the drive IC 34 (CML circuit 41) is set to 100Ω, and the differential impedance $Z_{diff1}$ is accordingly set to 100Ω. Further, the differential impedance $Z_{diff2}$ is set to 50Ω. The differential output impedance of the CML circuit 41 is basically twice the resistance value (hereinafter represented by Rd) of the output resistors Rd, and hence with Rd and $Z_{diff1}$ having a relationship satisfying Rd=$Z_{diff1}$/2 impedance matching between the CML circuit 41 and the first differential transmission line can be achieved. In other words, with Rd being set to 50Ω, for example, impedance matching with the differential transmission line 43 having $Z_{diff1}$ of 100Ω is achieved.

Between the connecting portions, the resistive element Rm is arranged. Specifically, the resistive element Rm has both ends connected to a connecting portion 44a of the transmission line 43a and a connecting portion 44b of the transmission line 43b. The configuration of the connecting portions including the resistive element Rm solves the problem accompanying an impedance gap between the first differential transmission line and the second differential transmission line, and is described later as a reflection absorption circuit.

In the transmission lines 43a and 43b, DC blocking capacitors C1 and C2 can be inserted in series. A capacitance value of each of the capacitors C1 and C2 may be, for example, about 0.1 microfarad (μF). To terminals on the semiconductor laser LD1 side of the capacitors C1 and C2, bias circuits 45a and 45b configured to supply a bias current to the semiconductor laser LD1 can be connected. Specifically, the bias circuit 45a is provided between a power supply V_anode and the transmission line 43a, and the bias circuit 45b is provided between a power supply V_cathode and the transmission line 43b. Further, on the drive circuit side of the capacitors C1 and C2 of the transmission lines 43a and 43b, bias circuits 46a and 46b can be connected. In the first embodiment, connection positions of the bias circuits 46a and 46b and the transmission lines 43a and 43b are between the connecting portions 44a and 44b and the drive circuit, and at the positions, the bias circuit 46a is provided between a power supply $V_{cc}$ and the transmission line 43a, and the bias circuit 46b is provided between the power supply $V_{cc}$ and the transmission line 43b. Those bias circuits 45a, 45b, 46a, and 46b are designed to have sufficiently high impedances so as not to affect, or so as to minimize the effect on the characteristics of the differential transmission line 43. Each of the bias circuits 45a, 45b, 46a, and 46b may be formed of, for example, a combination of an inductor, a ferrite bead, and a resistor.

In the first embodiment, in the differential transmission line 43, six sections S1 to S6 (not shown) arrayed in the stated order from the drive IC 34 side to the semiconductor laser LD1 side are defined. Of the six sections S1 to S6, the sections S1 to S4 belong to the PCB portion. The section S1 is a section from the output terminals OUT1 and OUT2 of the drive IC 34 to the connection positions of the bias circuits 46a and 46b. Further, the section S2 is a section from the connection positions of the bias circuits 46a and 46b to the connecting portions 44a and 44b, and the section S3 is a section from the connecting portions 44a and 44b to one ends of the capacitors C1 and C2. Still further, the section S4 is a section from the other ends of the capacitors C1 and C2 to a boundary between the printed circuit board 26 and the flexible printed circuits 28. The section S5 is the FPC portion. The section S6 is the TOSA portion, and is a section from a position at which the TOSA 30B is connected to the flexible printed circuits 28, to the anode and the cathode of the semiconductor laser LD1.

In the first embodiment, portions belonging to the sections S1 to S6 of the transmission line 43a are denoted by transmission lines 51a to 56a as illustrated in FIG. 4, and portions belonging to the sections S1 to S6 of the transmission line 43b are denoted by transmission lines 51b to 56b as illustrated in FIG. 4. In other words, in the transmission line 43a, the transmission lines 51a and 52a, the connecting portion 44a, the transmission line 53a, the capacitor C1, and the transmission lines 54a, 55a, and 56a are connected in series, and in the transmission line 43b, the transmission lines 51b and 52b, the connecting portion 44b, the transmission line 53b, the capacitor C2, and the transmission lines 54b, 55b, and 56b are connected in series. It should be noted here that, in the transmission lines 43a and 43b, resistive elements connected in series to the transmission lines are not arranged.

The differential transmission line 43 is configured to transmit a high-frequency electric signal for driving the semiconductor laser LD1. For example, the differential transmission line 43 (transmission lines 51a to 54a and 51b to 54b) in the sections S1 to S4 in the PCB portion is microstriplines formed of the conductive layers and the dielectric layer of the printed circuit board 26. Similarly, the differential transmission line 43 (transmission lines 55a and 55b) in the section S5 in the FPC portion is microstriplines formed of the conductive layers and the dielectric layer of the flexible printed circuits 28. The differential transmission line 43 in those PCB portion and FPC portion may be formed of striplines, or coplanar waveguides.

The differential transmission line 43 (transmission lines 56a and 56b) in the section S6 in the TOSA portion is, as described above, a pair of coaxial lines including the holes in the stem and the lead pins of the TO-can package, and is basically arranged in the TO-can package. The differential transmission line 43 in the TOSA portion may be formed of microstriplines or striplines.

Of the differential transmission line 43, the differential impedance of the portion (transmission lines 51a and 51b) in the section S1 and the portion (transmission lines 52a and 52b) in the section S2, which belong to the first differential transmission line, is set to $Z_{diff1}$. Meanwhile, the differential impedance of the portion (transmission lines 53a and 53b) in the section S3, the portion (transmission lines 54a and 54b) in the section S4, the portion (transmission lines 55a and 55b) in the section S5, and the portion (transmission lines 56a and 56b) in the section S6, which belong to the second differential transmission line, is set to $Z_{diff2}$.

The first differential transmission line and the second differential transmission line, and the resistive element Rm provided between the connecting portions 44a and 44b of the first differential transmission line and the second differential transmission line form the reflection absorption circuit configured to reduce a reflection coefficient Γ for the electric signal traveling from the second differential transmission line side to the first differential transmission line side. In other words, the impedance gap at the connecting portions of the first differential transmission line and the second differential transmission line may cause reflection for the signal traveling from the second differential transmission line side to the first differential transmission line side, but the reflection is reduced through the arrangement of the resistive element Rm. For example, a drive signal from the drive IC 34 is reflected by the input terminals of the semiconductor laser LD1 to generate a signal component returning from the second differential transmission line side to the first differential transmission line side, but with the provision of the reflection absorption circuit including the resistive element Rm, multireflection caused by the signal component being reflected again and heading toward the semiconductor laser LD1 is reduced.

Here, one section on both sides of the connecting portions 44a and 44b in the differential transmission line 43 is regarded as a reflection absorption circuit 60 for convenience. In other words, the reflection absorption circuit 60 includes one section Sa adjacent to the connecting portions 44a and 44b in the first differential transmission line, one section S13, adjacent to the connecting portions 44a and 44b in the second differential transmission line, the connecting portions 44a and 44b, and the resistive element Rm arranged to connect the connecting portions.

Figure 5:
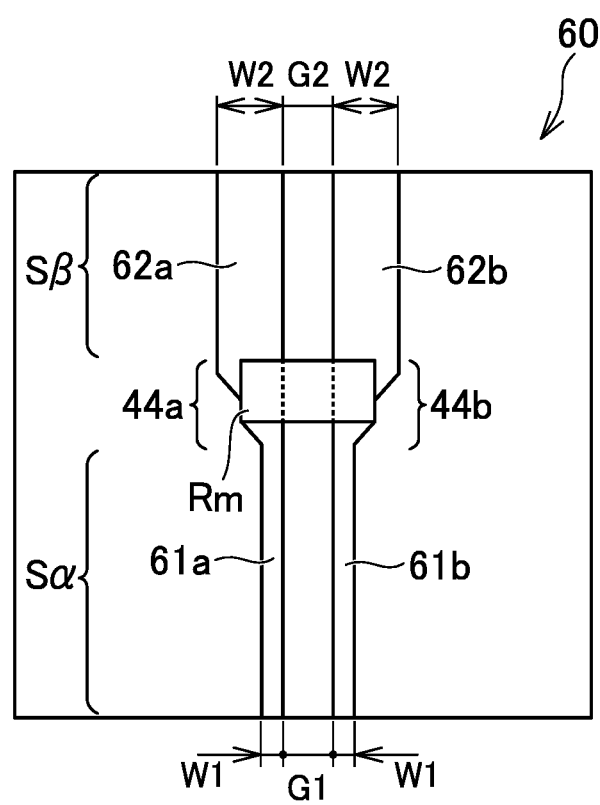
FIG. 5 is a schematic plan view for illustrating the structure of a reflection absorption circuit in the first embodiment of the present invention.

FIG. 5 is a schematic plan view for illustrating the structure of the reflection absorption circuit 60. In FIG. 5, an upper side is a side leading to the semiconductor laser LD1, and a lower side is a side leading to the drive IC 34. In the first embodiment, the reflection absorption circuit 60 is arranged on the printed circuit board 26. The differential transmission line 43 in the sections Sα and Sβ is microstriplines, and the microstriplines are formed of strip conductors made of conductors in a surface layer of the circuit board, a dielectric layer arranged below the strip conductors, and a ground conductor layer arranged in plane under the dielectric layer. Specifically, the reflection absorption circuit 60 includes strip conductors 61a and 61b forming transmission lines in the section Sa, and strip conductors 62a and 62b forming transmission lines in the section S13. Each of the strip conductors has a planar shape extending in an elongated manner along a transmission direction of the signal, the strip conductors 61a and 61b each have a width W1 and extend in parallel with a gap G1 therebetween, and the strip conductors 62a and 62b each have a width W2 and extend in parallel with a gap G2 therebetween. Meanwhile, the ground conductor layer is formed not only in a region facing the strip conductors, but also in regions extending on both sides of the strip conductors, and is formed over the entire surface of circuit board, for example.

The strip conductors each have a thickness of, for example, 37 pm. Further, a thickness of the dielectric layer, that is, a distance between the conductive layer at the surface and the ground conductor layer, which form the strip conductors, is 60 pm, and the dielectric layer has a relative dielectric constant of 3.5. Dimensions of the strip conductors 61a and 61b and the strip conductors 62a and 62b can be designed relatively easily with the use of an electromagnetic field analysis tool, for example, to obtain a desired characteristic impedance value. In the first embodiment, as an example, a gap G1 between the strip conductors 61a and 61b is set to 0.25 millimeters (mm), and a width W1 of each of the strip conductors 61a and 61b is set to 0.11 mm, to thereby set the differential impedance $Z_{diff1}$ of the differential transmission line 43 in the section Sα to 100Ω. Further, a gap G2 between the strip conductors 62a and 62b is set to 0.25 mm, and a width W2 of each of the strip conductors 62a and 62b is set to 0.34 mm, to thereby set the differential impedance $Z_{diff2}$ of the differential transmission line 43 in the section Sβ to 50Ω.

In the first embodiment, the section Sα is the section S2, and the strip conductors 61a and 61b correspond to the transmission lines 52a and 52b, respectively. Further, the section S13, is the section S3, and the strip conductors 62a and 62b correspond to the transmission lines 53a and 53b, respectively. For the section S1, which is the first differential transmission line on the printed circuit board 26 as with the section S2, the strip conductors of the transmission lines 51a and 51b may be set to a width and a gap that are common to those of the section S2, to thereby set the differential impedance $Z_{diff1}$ of 100Ω. Similarly, for the section S4, which is the second differential transmission line on the printed circuit board 26 as with the section S3, strip conductors of the transmission lines 54a and 54b may be set to a width and a gap that are common to those of the section S3, to thereby set the differential impedance $Z_{diff2}$ of 50Ω. Also for the microstriplines on the flexible printed circuits 28, specifically, the differential transmission line in the section S5, while keeping in mind that thicknesses and the relative dielectric constants of the conductive layers and the dielectric layer of the circuit board may be different from those of the printed circuit board 26, the dimensions of the strip conductors may be set in a manner similar to the differential transmission line on the printed circuit board 26 to obtain the differential impedance $Z_{diff2}$ Of 50Ω.

The strip conductors in the connecting portions 44a and 44b form the transmission lines, and serve as pads for connecting terminals of the resistive element Rm. Therefore, a width W, a length L, and a shape of each of the strip conductors in the connecting portions 44a and 44b are determined in consideration of a position and a size of the pad.

For example, when the resistive element Rm is a surface-mount chip resistor of the 0603 size, and is connected between the connecting portions 44a and 44b, an arrangement region of the resistive element Rm has sizes of 0.3 mm in the length L direction, and 0.6 mm in the width W direction. Here, the dimension being 0.6 mm of the resistive element Rm along the width W direction of the strip conductors is larger than 0.47 mm, which is an arrangement width (2·W1+G1) of the strip conductors 61a and 61b in the section Sα, and is smaller than 0.93 mm, which is an arrangement width (2·W2+G2) of the strip conductors 62a and 62b in the section S. Therefore, in a simple manner, the connecting portions 44a and 44b are adapted to the arrangement region of the resistive element Rm with the width W of each of the strip conductors being 0.175 mm, a gap G between the strip conductors being 0.25 mm, and a length L of the strip conductors being 0.3 mm, and have a configuration in which the differential impedance also changes gradually along with the change in width of the strip conductors between the section Sα and the section S.

Further in the configuration illustrated in FIG. 5, the strip conductors in the connecting portions have patterns so that the width of each of the strip conductors is continuously changed between the pads of the resistive element Rm and the sections Sα and Sβ. Specifically, for the length L direction, the connecting portions 44a and 44b include a portion that is expanded from the arrangement region of the resistive element Rm on the section Sα side, and in the portion, the width W of the strip conductors is increased continuously and monotonously from W1 to a value corresponding to the arrangement of the pad of the resistive element Rm. Further, for the length L direction, from a position in the middle of the pad of the resistive element Rm toward the section Sβ, the width W of the strip conductors is increased continuously and monotonously from the value corresponding to the arrangement of the pad of the resistive element Rm to W2.

The reflection coefficient Γ of the reflection absorption circuit 60 as seen from the semiconductor laser LD1 side can be given, when a resistance value of the resistive element Rm is R, by the following expression.

$$\Gamma = \frac{\{(Z_{diff1} - Z_{diff2}) \cdot R - Z_{diff1} \cdot Z_{diff2}\}}{\{(Z_{diff1} + Z_{diff2}) \cdot R + Z_{diff1} \cdot Z_{diff2}\}} \quad (1)$$

Figure 6:
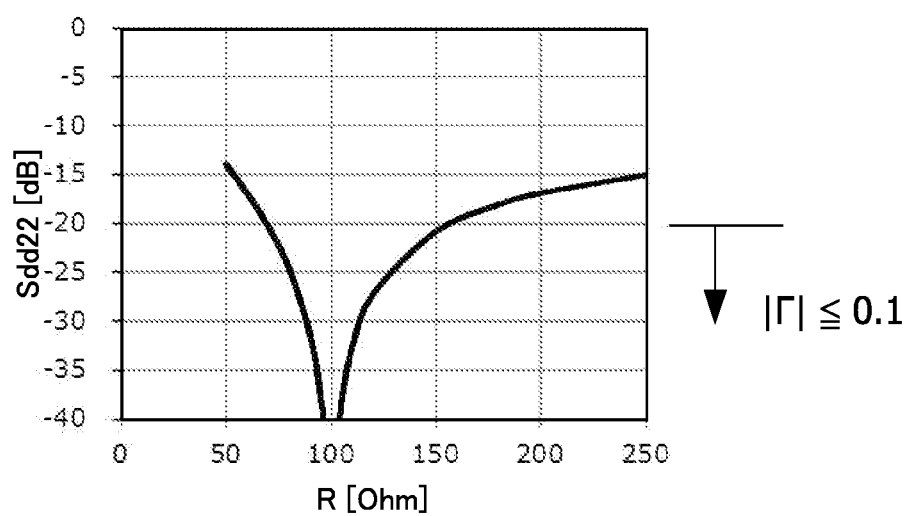
FIG. 6 is a graph for showing differential reflection characteristics of the reflection absorption circuit in the first embodiment of the present invention as seen from a semiconductor laser side.

FIG. 6 is a graph for showing differential reflection characteristics of the reflection absorption circuit 60 in the transmission unit 40 of the optical module 10 according to the first embodiment as seen from the semiconductor laser LD1 side. A horizontal axis R of the graph indicates the resistance value of the resistive element Rm. Further, a vertical axis Sdd22 indicates an S-parameter for an intensity of a reflected signal with respect to the signal that has entered the reflection absorption circuit 60 from the semiconductor laser LD1 side in decibels (dB), and the S-parameter Sdd22 can be given by the reflection coefficient Γ calculated in Expression (1).

From consideration based on experiments, when Sdd22 is −20 dB or less, disturbance in the input signal to the semiconductor laser caused by unnecessary multireflection of the electric waveform could be suppressed, and a sufficiently satisfactory light output waveform could be obtained. The condition that Sdd22-20 dB corresponds to |Γ|≤0.1. Therefore, the resistance value R of the resistive element Rm is set to a value with which an absolute value of the reflection coefficient Γ for the signal traveling from the second differential transmission line side to the first differential transmission line side is 0.10 or less.

In the differential transmission line 43 in which $Z_{diff1}$=100 S2 and $Z_{diff2}$=50Ω, when the resistance value R of the resistive element Rm is set to a range of from 69.4Ω to 157.1Ω, the condition that |Γ|≤0.1 can be satisfied, and especially when R=100 Ω, Γ=0 is theoretically established, that is, no reflection can be achieved. Therefore, in the differential transmission line 43 in which $Z_{diff1}$=100Ω and $Z_{diff2}$=50Ω, the resistance value R can be selected in the range of from 69.4Ω to 157.1Ω, and is preferably set to a value that is as close to 100Ω as possible.

Figure 7:
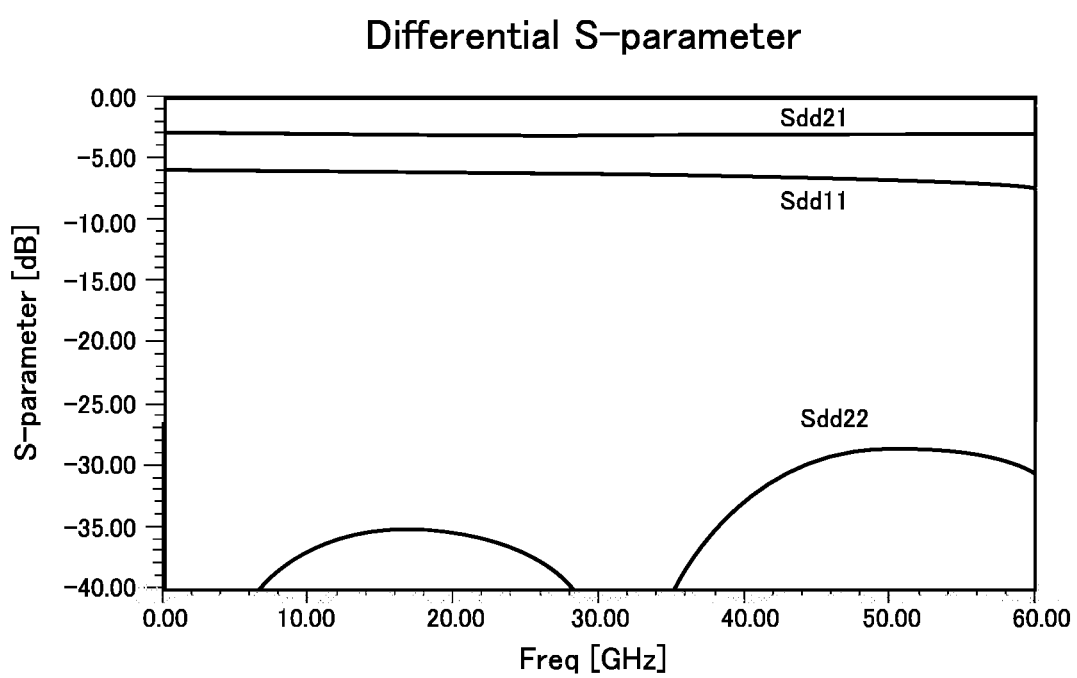
FIG. 7 is a graph for showing, in the reflection absorption circuit illustrated in FIG. 5, differential small signal characteristics obtained when a resistance value of a resistive element (Rm) is set to 100Ω.

FIG. 7 is a graph for showing, in the reflection absorption circuit 60 illustrated in FIG. 5, differential small signal characteristics obtained when the resistance value R of the resistive element Rm is set to 100Ω, in which a horizontal axis indicates a frequency, and a vertical axis indicates an S-parameter. This characteristic was calculated by an electromagnetic field analysis tool, and in FIG. 5, a differential port 1 is arranged on the lower side (side leading to the drive IC 34), and a differential port 2 is arranged on the upper side (side leading to the semiconductor laser LD1). A differential impedance of the differential port 1 is normalized with 100Ω, and a differential impedance of the differential port 2 is normalized with 50Ω.

As shown in FIG. 7, a differential reflection coefficient Sdd22 as seen from the semiconductor laser LD1 side is reduced sufficiently to as small as −28 dB or less in a wide frequency range of from 0 gigahertz (GHz) to 60 GHz, which indicates that, with the reflection absorption circuit 60 formed of the microstriplines on the printed circuit board 26 and the resistive element Rm, which is a chip resistor, a highly satisfactory reflection absorption circuit can be achieved.

FIG. 7 further shows that the differential reflection coefficient Sdd11 as seen from the drive IC 34 side is about −6 dB, and that a function of reducing reflection in the direction by the reflection absorption circuit 60 is weak. Meanwhile, FIG. 7 shows that a differential transmission characteristic Sdd21 is about −3 dB, that an amount of loss caused when a differential drive signal from the drive IC 34 passes through the reflection absorption circuit 60 can be reduced to as relatively low as about 3 dB, and that the amount of loss can be maintained to a substantially constant value in the wide frequency range of from 0 GHz to 60 GHz.

Figure 8A:
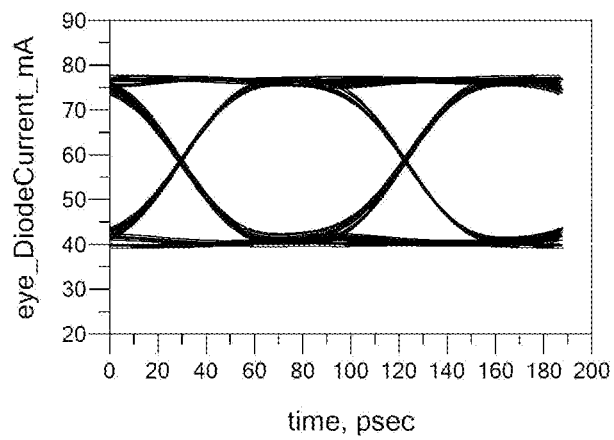
FIG. 8A is an eye diagram of a current waveform at a position $P_A$ of the transmission unit of the optical module according to the first embodiment of the present invention.
Figure 8B:
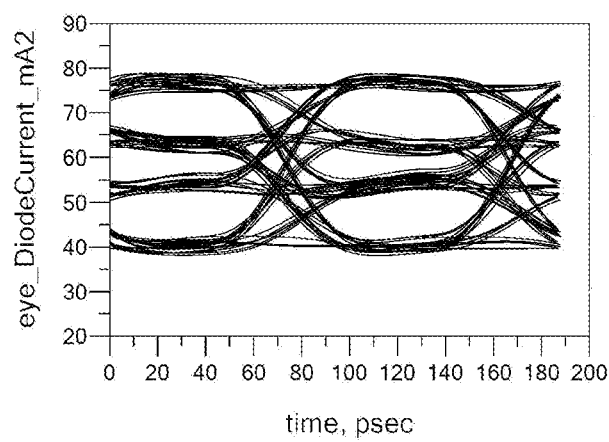
FIG. 8B is an eye diagram of a current waveform at a position $P_B$ of the transmission unit of the optical module according to the first embodiment of the present invention.
Figure 8C:
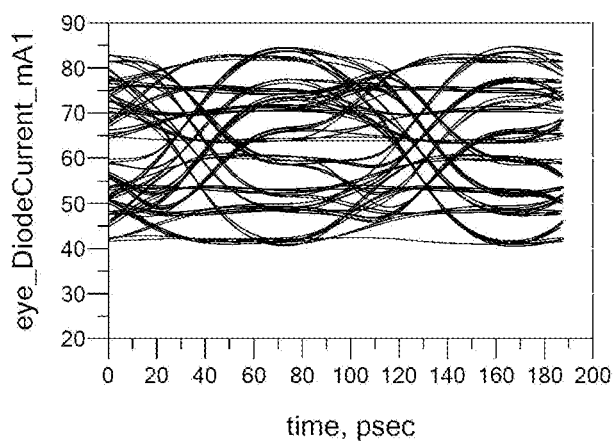
FIG. 8C is an eye diagram of a current waveform at a position $P_C$ of the transmission unit of the optical module according to the first embodiment of the present invention.

FIG. 8A to FIG. 8C are eye diagrams of a current waveform at respective portions of the transmission unit 40 obtained when the reflection absorption circuit 60 formed on the printed circuit board 26 of FIG. 5 is applied as the reflection absorption circuit of the transmission unit 40 of the optical module 10 of FIG. 4. FIG. 8A, FIG. 8B, and FIG. 8C show waveforms at positions $P_A$, $P_B$, and $P_C$ illustrated in the circuit diagram of FIG. 4, respectively. The position $P_A$ is an anode terminal of the semiconductor laser LD1, the position $P_B$ is an output terminal (on the semiconductor laser LD1 side) of the reflection absorption circuit 60, and the position $P_C$ is an input terminal (on the drive IC 34 side) of the reflection absorption circuit 60.

FIG. 8A to FIG. 8C show results obtained by a circuit simulator, and to circuit parameters of the reflection absorption circuit 60, the result of small signal characteristics (4-port S-parameters) of FIG. 7 calculated by the electromagnetic field analysis tool is applied. Further, a modulated signal of the drive IC 34 employed a modulation method of non-return-to-zero (NRZ) and a bit rate of 10.7 Gbit/s.

At the position $P_B$, there are a propagating wave traveling to the semiconductor laser LD1, and a reverse wave coming from the semiconductor laser LD1 side. The reverse wave is a reflected wave with respect to the propagating wave traveling to the semiconductor laser LD1, and is caused by impedance mismatch between the second differential transmission line having the differential impedance $Z_{diff2}$ of 50Ω and the semiconductor laser LD1 having an impedance lower than the differential impedance $Z_{diff2}$. At the position $P_B$, the propagating wave and the reflected wave overlap each other to cause a complicated current waveform as shown in FIG. 8B.

Meanwhile, FIG. 8A shows a current waveform at the position $P_A$, that is, at the anode terminal of the semiconductor laser. The reflected wave seen at the above-mentioned position $P_B$ is sufficiently absorbed by the reflection absorption circuit 60 after the position $P_B$, and hence re-reflection caused by the mismatch between the first differential transmission line and the second differential transmission line is suppressed. Therefore, at the position $P_A$, as shown in FIG. 8A, the disturbance of the waveform caused by the re-reflected wave is suppressed, and a satisfactory current waveform with small jitter component or noise component is obtained. Here, when the DFB-LD is used as the semiconductor laser LD1, a forward current value of a diode as an input and a laser beam intensity as an output have satisfactory linearity.

Therefore, when the waveform of current flowing through the diode is satisfactory, a satisfactory laser beam waveform is obtained as the output of the optical transmitter. As described above, according to the optical module 10 of the first embodiment, the satisfactory current waveform can be obtained, that is, the satisfactory light output waveform can be obtained while minimizing an attenuation of the signal to the semiconductor laser.

At the position $P_C$, in addition to the propagating wave from the drive IC 34 and the reflected wave from the semiconductor laser LD1, there is a reflected wave from an input side of the reflection absorption circuit 60, and those waves overlap one another to cause an even complicated current waveform as shown in FIG. 8C as compared to FIG. 8B.

According to the first embodiment described above, the drive IC having the differential output impedance of 100Ω and the TOSA using the TO-can package in which the transmission lines have the differential impedance of 50Ω can be used. Further, the multireflection of the electric signal between the drive IC and the semiconductor laser can be suppressed, and the attenuation of the signal to the semiconductor laser can be minimized, to thereby obtain the satisfactory light output waveform. As a result, the optical module 10 that achieves both of the downsizing and the reduction in cost of the TOSA package can be provided.

In the first embodiment, the pair of differential output impedances of the drive IC 34 are 100Ω as an example, but the present invention is not limited to this value. For example, when a pair of differential output impedances of the drive IC 34 are 80Ω, the differential impedance $Z_{diff1}$ of the first differential transmission line is set to 80Ω, and the differential impedance $Z_{diff2}$ of the second differential transmission line is set to 50Ω. Further, the resistance value R of the resistive element Rm of the reflection absorption circuit 60 can be selected from the range of from 83.7Ω to 258.2Ω in order to establish $|\Gamma|\leq0.1$, and is preferably set to a value that is as close to 133.3Ω as possible.

Second Embodiment

A second embodiment of the present invention is different from the first embodiment in the circuit of the transmission unit 40, in particular, the configuration of the differential transmission line 43. The first and second embodiments are basically the same otherwise, and FIG. 1 to FIG. 3 are incorporated in the second embodiment, for example.

Figure 9:
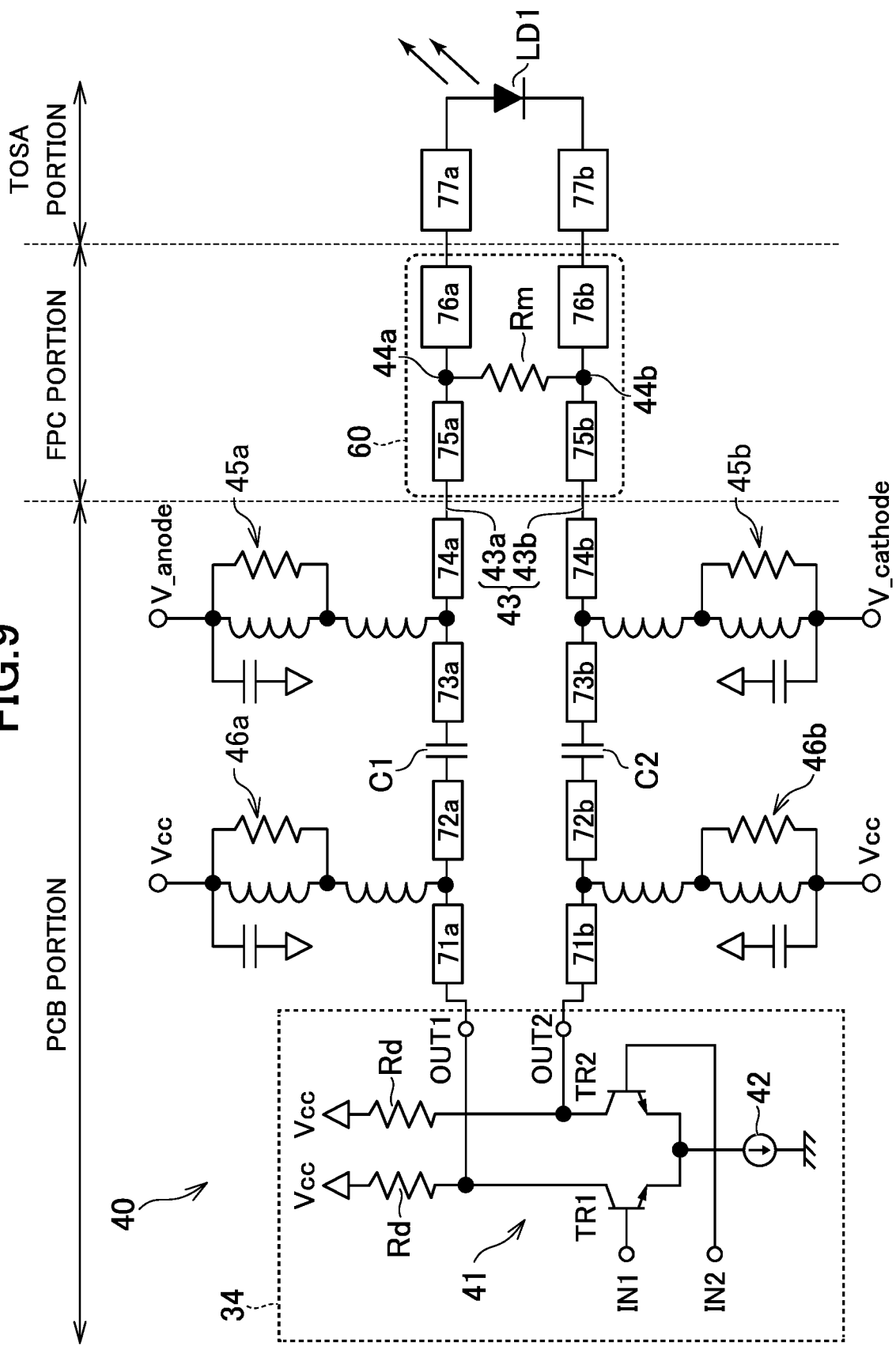
FIG. 9 is a schematic circuit diagram of a transmission unit of an optical module according to a second embodiment of the present invention.

FIG. 9 is a schematic circuit diagram of the transmission unit 40 of the optical module 10 according to the second embodiment.

This circuit is described mainly in terms of differences from the circuit in the first embodiment of FIG. 4. A main difference is that, in short, the reflection absorption circuit 60 is arranged on the flexible printed circuits 28.

In the second embodiment, in the differential transmission line 43, seven sections S1 to S7 (not shown) arrayed in the stated order from the drive IC 34 side to the semiconductor laser LD1 side are defined. Of the seven sections S1 to S7, the sections S1 to S4 belong to the PCB portion. The section S1 is a section from the output terminals OUT1 and OUT2 of the drive IC 34 to the connection positions of the bias circuits 46a and 46b. The section S2 is a section from the connection positions of the bias circuits 46a and 46b to one ends of the capacitors C1 and C2. The section S3 is a section from the other ends of the capacitors C1 and C2 to connection positions of the bias circuits 45a and 45b, and the section S4 is a section from the connection positions of the bias circuits 45a and 45b to the boundary between the printed circuit board 26 and the flexible printed circuits 28. The sections S5 and S6 belong to the FPC portion. The section S5 is a section from the boundary between the printed circuit board 26 and the FPC portion to the connecting portions 44a and 44b, and the section S6 is a section from the connecting portions 44a and 44b to a boundary between the FPC portion and the TOSA 30B. Then, the section S7 is the TOSA portion, and is a section from the position at which the TOSA 30B is connected to the flexible printed circuits 28, to the anode and the cathode of the semiconductor laser LD1.

In the second embodiment, portions belonging to the sections S1 to S7 of the transmission line 43a are denoted by transmission lines 71a to 77a as illustrated in FIG. 9, and portions belonging to the sections S1 to S7 of the transmission line 43b are denoted by transmission lines 71b to 77b as illustrated in FIG. 9. In other words, in the transmission line 43a, the transmission lines 71a and 72a, the capacitor C1, the transmission lines 73a, 74a, and 75a, the connecting portion 44a, and the transmission lines 76a and 77a are connected in series, and in the transmission line 43b, the transmission lines 71b and 72b, the capacitor C2, the transmission lines 73b, 74b, and 75b, the connecting portion 44b, and the transmission lines 76b and 77b are connected in series. Here, in the transmission lines 43a and 43b, as in the first embodiment, resistive elements are not arranged in series.

For example, the differential transmission line 43 (transmission lines 71a to 76a and 71b to 76b) in the sections S1 to S6 in the PCB portion and the FPC portion are formed of microstriplines as in the first embodiment, but may be formed of striplines or coplanar waveguides. Further, the differential transmission line 43 (transmission lines 77a and 77b) in the section S7 in the TOSA portion is formed similarly to the section S6 in the first embodiment.

Of the differential transmission line 43, the portions (transmission lines 71a to 75a and 71b to 75b) in the sections S1 to S5 form the first differential transmission line having the differential impedance $Z_{diff1}$, and the portions (transmission lines 76a, 77a, 76b, and 77b) in the sections S6 and S7 form the second differential transmission line having the differential impedance $Z_{diff2}$. As in the first embodiment, $Z_{diff1}$ is 100Ω, and $Z_{diff2}$ is 50Ω, for example.

As described above, in the second embodiment, the reflection absorption circuit 60 is arranged on the flexible printed circuits 28. Specifically, the structure illustrated in FIG. 5 is formed on the flexible printed circuits 28, and in the second embodiment, the sections S5 and S6 correspond to the sections Sα and Sβ, of FIG. 5, respectively. In other words, the strip conductors 61a and 61b of FIG. 5 correspond to the transmission lines 75a and 75b of FIG. 9, respectively, and the strip conductors 62a and 62b correspond to the transmission lines 76a and 76b, respectively. Widths and gaps of the strip conductors in the sections Sα and Sβ, and the connecting portions 44a and 44b, for example, may be different from values thereof in the printed circuit board 26 in the first embodiment, and are designed based on thicknesses and the relative dielectric constants of the conductive layers and the dielectric layer in the flexible printed circuits 28. Meanwhile, the resistance value R of the resistive element Rm arranged between the connecting portions 44a and 44b is set based on the differential impedances $Z_{diff1}$ and $Z_{diff2}$ as in the first embodiment. Specifically, the resistance value R is set so that $|\Gamma|\leq0.1$ is established, and when $Z_{diff1}=100\Omega$ and $Z_{diff2}=50\Omega$, the resistance value R may be selected in the range of from 69.4Ω to 157.1Ω.

Also with the second embodiment described above, the effects described in the first embodiment can be obtained. In other words, the drive IC having the differential output impedance of 100Ω and the TOSA using the TO-can package in which the transmission lines have the differential impedance of 50Ω can be used. Further, the multireflection of the electric signal between the drive IC and the semiconductor laser can be suppressed, and the attenuation of the signal to the semiconductor laser can be minimized, to thereby obtain the satisfactory light output waveform. As a result, the optical module 10 that achieves both of the downsizing and the reduction in cost of the TOSA package can be provided.

Further, according to the second embodiment, with the reflection absorption circuit 60 being arranged in the flexible printed circuits 28, it is possible to obtain an advantage that prototyping and consideration of the reflection absorption circuit 60 can be performed in a shorter period of time only with design and production of the flexible printed circuits 28.

In the second embodiment, with points of current supply from the bias circuits 45a and 45b being arranged between the DC blocking capacitors C1 and C2 and the connecting portions 44a and 44b, the bias currents supplied from the bias circuits 45a and 45b to the semiconductor laser LD1 also flow through the resistive element Rm, and power consumption is increased accordingly. Therefore, the resistance value R may be selected in consideration of a reduction in power consumption in addition to the viewpoint of reducing $|\Gamma|$. For example, in the case where $Z_{diff1}=100\Omega$ and $Z_{diff2}=50\Omega$, when the resistance value R is selected in the range of from 69.4Ω to 157.1Ω, in which $|\Gamma^{\sqrt[3]{}}| \le 0.1$, the effect of reducing |Γ| by setting the resistance value R close to R=100Ω, and the effect of increasing the resistance value R to reduce the power consumption are put into consideration. For example, in consideration of both of the effects, a selection range of R in the second embodiment may be limited to a range of from 100Ω to 157.1Ω excluding a range smaller than 100Ω.

Third Embodiment

A third embodiment of the present invention is different from the first and second embodiments in the circuit of the transmission unit 40, in particular, the configuration of the differential transmission line 43. The third embodiment is basically the same as the first and second embodiments otherwise, and FIG. 1 to FIG. 3 are incorporated in the third embodiment, for example.

Figure 10:
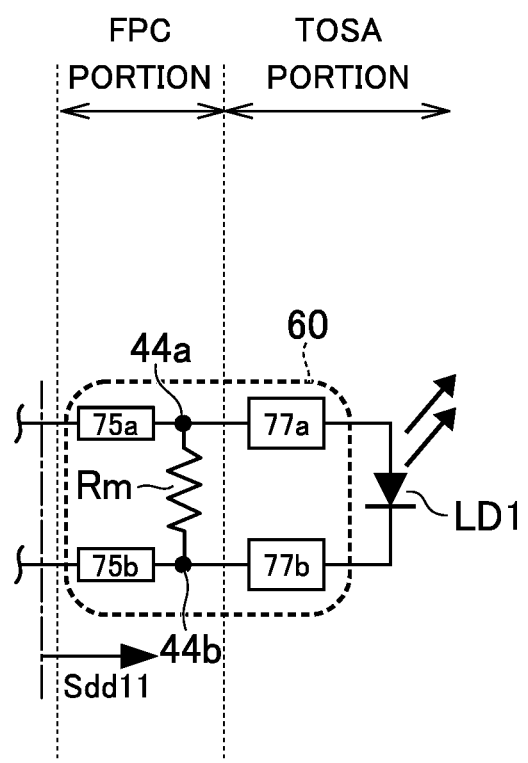
FIG. 10 is a schematic circuit diagram of a characteristic portion of a differential transmission line in a third embodiment of the present invention.

The differential transmission line 43 in the third embodiment has a configuration obtained by omitting, from the differential transmission line 43 in the second embodiment, the transmission lines 76*a* and 76*b* in the section S6 on the flexible printed circuits 28. FIG. 10 is a schematic circuit diagram of a portion of the differential transmission line 43 in the third embodiment with the difference from the second embodiment, and shows the FPC portion and the TOSA portion. The PCB portion of the differential transmission line 43 in the third embodiment may be the same as the PCB portion of FIG. 9 described in the second embodiment.

In the third embodiment, of the reflection absorption circuit 60 formed of the connecting portions 44*a* and 44*b* having the resistive element Rm arranged therebetween and the differential transmission line in the sections Sα and Sβ, on both sides of the connecting portions 44*a* and 44*b*, the transmission lines 75*a* and 75*b* forming the first differential transmission line in the section Sa, and the connecting portions 44*a* and 44*b* and the resistive element Rm are arranged on the flexible printed circuits 28, and the second differential transmission line in the section Sβ is formed of the transmission lines 77*a* and 77*b* in the TOSA 30B.

The transmission lines 75*a* and 75*b* and the connecting portions 44*a* and 44*b* are formed of microstriplines, for example, on the flexible printed circuits 28 as in the second embodiment. The transmission lines 77*a* and 77*b* are formed, as with the section S6 in the first embodiment or the section S7 in the second embodiment, of coaxial lines provided in the package of the TOSA 30B. As in the first and second embodiments, $Z_{diff1}$ is 100Ω, and $Z_{diff2}$ is 50Ω, for example.

The transmission lines 77*a* and 77*b* are, for example, coaxial lines having an outside diameter of 0.7 mm and an inside diameter of 0.3 mm, a glass material having a relative dielectric constant of 4.1 is used as a dielectric, and a length of the coaxial lines, that is, a thickness of the stem forming a metal package of the TOSA 30B is set to 1.2 mm, to thereby form a differential transmission line having the differential impedance $Z_{diff2}$ of 50Ω. When an electrical length of the differential transmission line is calculated, the electrical length corresponds to ¼ wavelength at a frequency of 31 GHz. Here, when the DFB-LD is used as the semiconductor laser LD1, a differential resistance under a forward current bias, that is, the differential impedance is relatively small at 6Ω to 8Ω. Meanwhile, at the frequency of 31 GHz, the differential transmission line formed of the transmission lines 77*a* and 77*b* functions as a ¼-wavelength impedance transformer, and hence the impedance obtained when the TOSA 30B is seen from the outside becomes sufficiently high at around the frequency. As a result, when the semiconductor laser LD1 side is seen from the drive IC 34, the impedance of the resistive element Rm becomes dominant.

Therefore, with the reflection absorption circuit 60 in the third embodiment, with the resistive element Rm being set to 100 S), a differential reflection characteristic Sdd11 can be brought close to a matching state at around the frequency of 31 GHz. In other words, the optical module 10 of the third embodiment can reduce the disturbance in electric waveform caused by the unnecessary multireflection in a high-frequency region, which is usually difficult to suppress especially in an optical transceiver having a modulation rate of from 25 Gbit/s to 28 Gbit/s, and hence has an advantage of being suitable in obtaining the satisfactory optical waveform.

Figure 11:
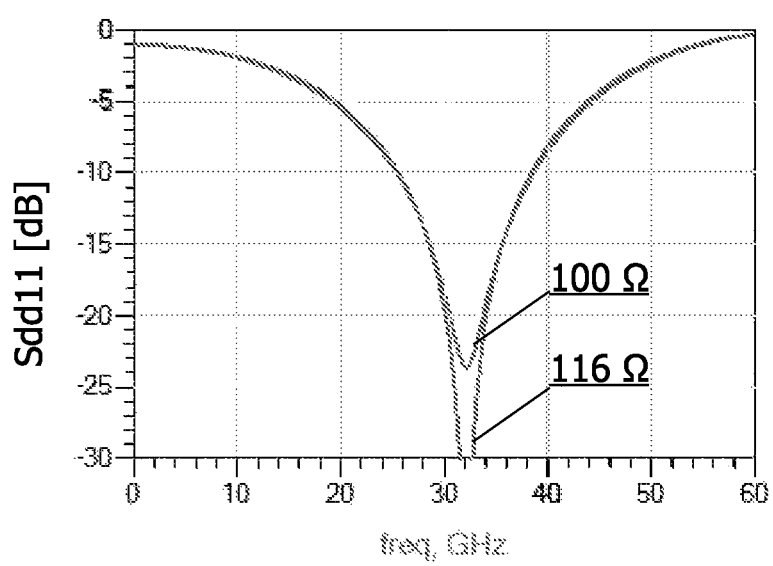
FIG. 11 is a graph for showing frequency characteristics of differential reflection characteristics obtained when a semiconductor laser is seen from an input side of a reflection absorption circuit in the third embodiment of the present invention.

FIG. 11 is a graph for showing frequency characteristics of the differential reflection characteristic Sdd11 obtained when the semiconductor laser LD1 is seen from the input side of the reflection absorption circuit 60 in the third embodiment. When the resistance value R of the resistive element Rm is 100Ω, Sdd11 exhibits a value of −20 dB or less at around the frequency of 31 GHz, and satisfactory values of −10 dB or less are also obtained in a frequency range of from 25 GHz to 38 GHz. The resistance value R of the resistive element Rm is not limited thereto, and the resistance value R may be set to 116Ω, for example, to further reduce the reflection at around the frequency of 31 GHz.

Fourth Embodiment

In the first to third embodiments described above, the light output element is the semiconductor laser LD1 employing a direct modulation system, and as an example, a configuration in which the DFB-LD is used has been described. However, the semiconductor laser is not limited thereto, and a semiconductor laser employing another kind of direct modulation system may be used. For example, a Fabry-Perot semiconductor laser or a vertical cavity surface emitting laser (VSCEL) may be used.

Further, an integrated semiconductor laser employing an external modulation system may be used for the light output element, and there may be employed a configuration in which an integrated semiconductor laser LD2 employing the external modulation system is used instead of the semiconductor laser LD1 in the first to third embodiments described above, for example. A fourth embodiment of the present invention is an example of the configuration in which the semiconductor laser LD2 is used. Now, description is given of the fourth embodiment mainly in terms of differences from the first to third embodiments described above, while description of the same points is basically omitted. For example, FIG. 1 to FIG. 3 are also incorporated in the fourth embodiment.

Figure 12:
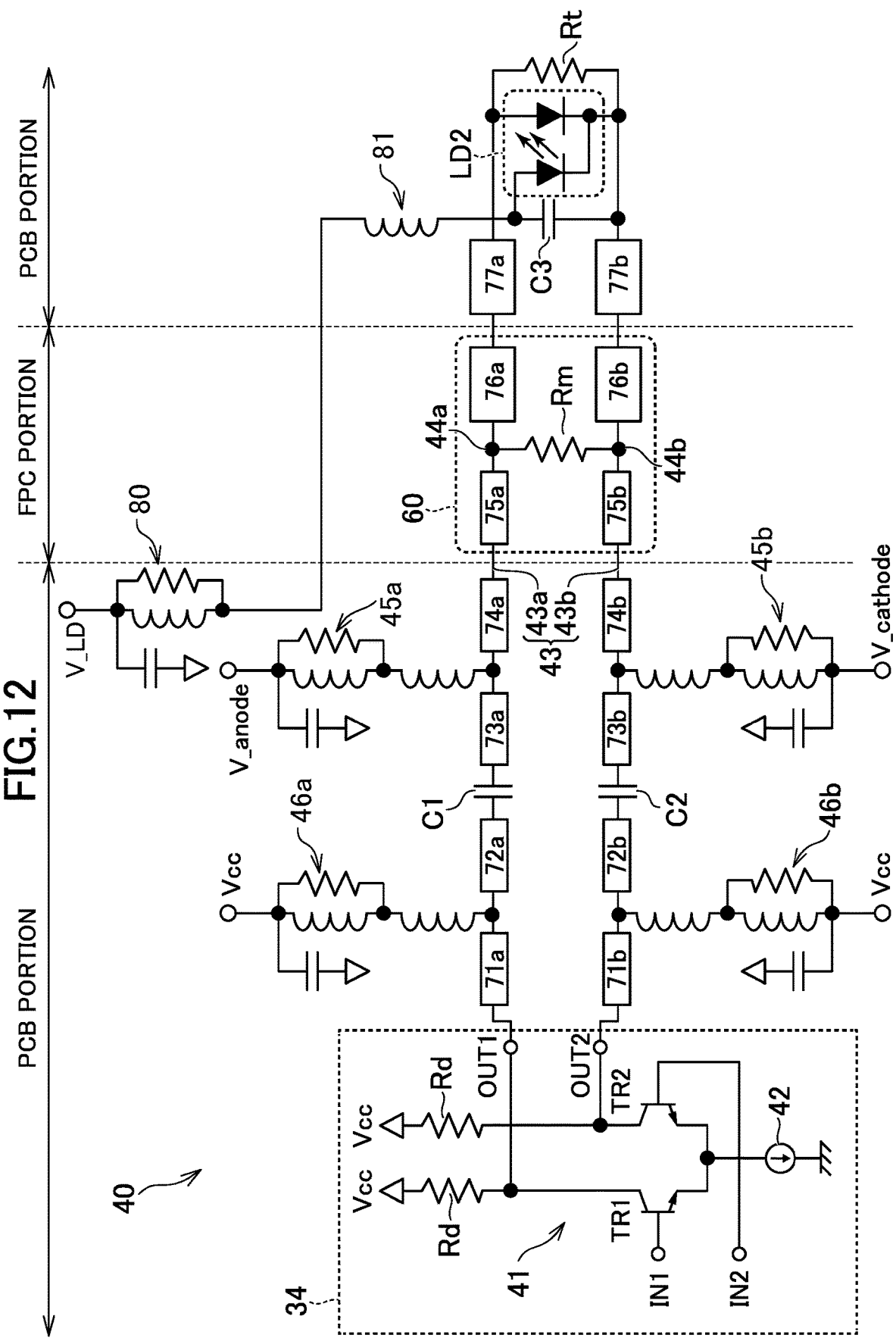
FIG. 12 is a schematic circuit diagram of a transmission unit of an optical module according to a fourth embodiment of the present invention.

FIG. 12 is a schematic circuit diagram of the transmission unit 40 of the optical module 10 according to the fourth embodiment.

This circuit has a configuration in which the integrated semiconductor laser LD2 is applied to the transmission unit 40 in the second embodiment. In other words, this circuit is basically different from the second embodiment in that the TOSA 30B has mounted thereon the integrated semiconductor laser LD2 employing the external modulation system instead of the semiconductor laser LD1. The integrated semiconductor laser LD2 is an element in which a light emitting element and an optical modulator are integrated.

The light emitting element is a DFB-LD, and the optical modulator is an electroabsorption (EA) modulator, for example. In the integrated semiconductor laser LD2, the DFB-LD is configured to output a laser beam having a constant intensity, and the optical modulator is configured to modulate the laser beam and output the modulated laser beam to the outside. Therefore, the differential transmission line 43 connects the output terminals OUT1 and OUT2 of the drive IC 34 and the optical modulator, and the modulated signal output from the drive IC 34 is input to the optical modulator.

Specifically, an anode terminal and a cathode terminal of the optical modulator are connected to the transmission line 77a (transmission line 43a) and the transmission line 77b (transmission line 43b), respectively.

Meanwhile, the DFB-LD is supplied with an electric current from a bias circuit to emit light. The bias circuit is formed of a portion 80 formed on the printed circuit board 26 and an inductor 81 in the TOSA 30B, and is configured to supply the electric current generated from a power supply V_LD to the anode of the DFB-LD.

The cathode of the DFB-LD is formed in common with a cathode of the optical modulator, and a capacitor C3 is connected as a decoupling capacitor between the cathode of the optical modulator and the anode of the DFB-LD. Further, between the anode and the cathode of the optical modulator, a resistive element Rt is connected and serves as a terminating resistor.

Also with the fourth embodiment described above, the effects described in the first embodiment are obtained. In other words, the drive IC having the differential output impedance of 100Ω and the TOSA using the TO-can package in which the transmission line has the differential impedance of 50Ω can be used. Further, the multireflection of the electric signal between the drive IC and the semiconductor laser can be suppressed, and the attenuation of the signal to the semiconductor laser can be minimized, to thereby obtain the satisfactory light output waveform. As a result, the optical module 10 that achieves both of the downsizing and the reduction in cost of the TOSA package can be provided.

While there have been described what are at present considered to be certain embodiments, it will be understood that various modifications may be made thereto, and it is intended that the appended claims cover all such modifications as fall within the true spirit and scope of the invention.

What is claimed is:

1. An optical module comprising:
   a light output element which includes a pair of input terminals, and is configured to output an optical signal modulated in accordance with an electric signal input to the light output element;
   a drive circuit which includes a pair of output terminals, and is configured to output a differential signal as the electric signal;
   a differential transmission line which establishes connection between the pair of input terminals and the pair of output terminals, and is formed of a pair of transmission lines,
      the differential transmission line including:
         a first differential transmission line which has a first characteristic impedance, and is connected to the pair of output terminals;
         a second differential transmission line which has a second characteristic impedance, and is connected to the pair of input terminals, the second characteristic impedance being smaller than the first characteristic impedance; and
         connecting portions configured to connect the first differential transmission line and the second differential transmission line in series with each other; and
   a resistive element having both ends connected to the connecting portions of the pair of transmission lines, respectively,
      the resistive element having a resistance value that is set to a value with which an absolute value of a reflection coefficient for a signal traveling from the second differential transmission line side to the first differential transmission line side is 0.10 or less.

2. The optical module according to claim 1, further comprising:
   a circuit board on which an integrated circuit having the drive circuit formed therein is mounted; and
   flexible printed circuits connected between the light output element and the circuit board,
   wherein the pair of transmission lines each include signal conductors formed of strip conductor foil formed on the circuit board and the flexible printed circuits.

3. The optical module according to claim 2,
   wherein the connecting portions are arranged on the circuit board, and
   wherein the resistive element is mounted on the circuit board.

4. The optical module according to claim 2,
   wherein the connecting portions are arranged on the flexible printed circuits, and
   wherein the resistive element is mounted on the flexible printed circuits.

5. The optical module according to claim 2, further comprising optical subassemblies each having the light output element mounted in a package thereof,
   wherein the optical subassemblies are connected to the flexible printed circuits, and
   wherein the second differential transmission line includes package wirings from connection terminals of the optical subassemblies to the flexible printed circuits, to the light output element.

6. The optical module according to claim 5,
   wherein the package is a TO-can package,
   wherein the TO-can package has holes formed in a stem, and lead pins which penetrate through the holes, and
   wherein the second differential transmission line includes, as the package wirings, a pair of coaxial lines including a pair of the lead pins connected to the pair of input terminals of the light output element, and a pair of the holes formed in correspondence with the lead pins.

7. The optical module according to claim 1, wherein the drive circuit has a differential output impedance that matches the first characteristic impedance.

8. The optical module according to claim 1,
   wherein each of a differential output impedance of the drive circuit and the first characteristic impedance is 100 ohms,
   wherein the second characteristic impedance is 50 ohms, and
   wherein the resistance value of the resistive element is 100 ohms.

9. The optical module according to claim 1, further comprising:
   a DC blocking capacitor inserted on the second differential transmission line; and bias circuits which are connected to the second differential transmission line on the light output element side as seen from the DC blocking capacitor, and are configured to supply a bias current to the light output element.

10. The optical module according to claim 1, wherein the drive circuit includes a current-mode logic circuit as an output circuit configured to output the differential signal to the pair of output terminals, wherein the current-mode logic circuit includes a pull-up resistor having a resistance value that is ½ of the first characteristic impedance, and wherein the optical module further comprises bias circuits each of which includes an inductance, and which are connected to the first differential transmission line.

11. An optical transmission device including the optical module of claim 1 mounted thereon.

* * * * *